US008546222B1

(12) United States Patent
Pan et al.

(10) Patent No.: US 8,546,222 B1
(45) Date of Patent: Oct. 1, 2013

(54) ELECTRICALLY ERASABLE PROGRAMMABLE NON-VOLATILE MEMORY

(71) Applicant: Texas Instruments Incorporated, Dallas, TX (US)

(72) Inventors: Shanjen Pan, Allen, TX (US); Allan T. Mitchell, Heath, TX (US); Weidong Tian, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/899,369

(22) Filed: May 21, 2013

Related U.S. Application Data

(62) Division of application No. 13/111,548, filed on May 19, 2011.

(51) Int. Cl.
*H01L 21/336* (2006.01)

(52) U.S. Cl.
USPC ........... 438/281; 257/209; 257/298; 438/275; 438/283

(58) Field of Classification Search
USPC ................. 257/209, 298, 314–316, 321–326, 257/408; 438/281, 197, 257, 264–266, 278, 438/283
See application file for complete search history.

(56) References Cited

U.S. PATENT DOCUMENTS

| | | | | |
|---|---|---|---|---|
| 5,925,908 | A * | 7/1999 | Dahl et al. | 257/316 |
| 6,452,835 | B1 * | 9/2002 | Diorio et al. | 365/185.03 |
| 2002/0142535 | A1 * | 10/2002 | Ho et al. | 438/201 |

* cited by examiner

*Primary Examiner* — Kimberly Rizkallah
*Assistant Examiner* — Errol Fernandes
(74) *Attorney, Agent, or Firm* — John R. Pessetto; Wade J. Brady, III; Frederick J. Telecky, Jr.

(57) ABSTRACT

In an embodiment of the invention, a method of fabricating a floating-gate PMOSFET (p-type metal-oxide semiconductor field-effect transistor) is disclosed. A silicide blocking layer (e.g. oxide, nitride) is used not only to block areas from being silicided but to also form an insulator on top of a poly-silicon gate. The insulator along with a top electrode (control gate) forms a capacitor on top of the poly-silicon gate. The poly-silicon gate also serves at the bottom electrode of the capacitor. The capacitor can then be used to capacitively couple charge to the poly-silicon gate. Because the poly-silicon gate is surrounded by insulating material, the charge coupled to the poly-silicon gate may be stored for a long period of time after a programming operation.

13 Claims, 12 Drawing Sheets

300 334 366 334 342 342 306 356 358 308 330 338 348 350 326 314 302 316

301 336 364 336 344 344 310 360 362 312 332 340 352 354 328 318 302 320

300 370 368 366 334 306 356 358 308 330 338 348 342 342 350 326 314 302 316

301 336 364 336 344 344 310 360 362 312 332 340 352 354 328 318 302 320

ELECTRICALLY ERASABLE PROGRAMMABLE NON-VOLATILE MEMORY

This Application is a Divisional of prior Application No. 46/111,548, filed May 19, 2011, currently pending.

BACKGROUND

A programmable read-only memory (PROM), a field programmable read-only memory (FPROM), an electrically erasable programmable read-only memory (EEPROM) and a one-time programmable non-volatile memory (OTP NVM) are forms of digital memory where the setting of each bit is locked by a fuse or an anti-fuse. These PROMs may be used to store programs permanently. One difference between a read-only memory (ROM) and a PROM is that with a PROM the programming is applied after the device is constructed.

PROMs are often manufactured blank and depending on the technology can be programmed on a wafer, during final test, or in a system. The availability of this technology allows companies to maintain a supply of blank PROMs in stock, and program them at the last minute to avoid a large volume commitment. These types of memories are frequently seen in video game consoles, mobile phones, radio-frequency identification tags, implantable medical devices, high-definition multimedia interfaces and in many other consumer and automotive electronic products.

An EEPROM can be erased and reprogrammed (written to) repeatedly through the application of higher than normal electrical voltage generated externally or internally in the case of modern EEPROMs. EEPROMs can be programmed and erased in the circuit in which they are found. EEPROMs allow multi-byte page operations. The number of times an EEPROM can be written is limited. In many applications, the limitation is approximately a million write operations. For this reason EEPROMs are typically used to provide configuration information rather than random information.

In some embodiments of an EEPROM, a FGMOSFET (floating gate metal oxide semiconductor field effect transistor) is used. The structure of a FGMOSFET) is similar to a conventional MOSFET (metal oxide semiconductor field effect transistor). The gate of the FGMOSFET is electrically isolated to create a floating node. One or more inputs are deposited above the floating gate and are electrically isolated from it. These inputs are only capacitively connected to the floating gate. Since the floating gate is surrounded by highly resistive material (insulators), the charge contained on the floating gate remains unchanged for a long period of time. Usually Fowler-Nordheim tunneling or hot-carrier injection mechanisms are used to modify the amount of charge stored on the floating gate.

In many IC processes, extra processing steps are required to produce FGMOSFETs along with MOSFETs. These extra steps increase the cost of making integrated circuits that contain FGMOSFETs and MOSFETs. A process that reduces the number of steps to manufacture FGMOSFETs along with MOSFETs is desirable.

DETAILED DESCRIPTION

The drawings and description, in general, disclose a method of fabricating a floating-gate PMOSFET (p-type metal-oxide semiconductor field-effect transistor), a PMOSFET and an analog capacitor on the same substrate. In one embodiment, a silicide blocking layer (e.g. oxide, nitride) is used not only to block areas from being silicided but to form an insulator on top of a poly-silicon gate. The insulator, along with a top electrode (control gate), forms a capacitor on top of the poly-silicon gate. The poly-silicon gate also serves at the bottom electrode of the capacitor. The capacitor can then be used to capacitively couple charge to the poly-silicon gate. Because the poly-silicon gate is surrounded by insulating material, the charge coupled to the poly-silicon gate may be stored for a long period of time after a programming operation.

The floating-gate PMOSFET may be programmed by applying a voltage Vpp to the source and Nwell of the floating-gate PMOSFET while grounding the control gate and the drain of the floating-gate PMOSFET. Applying a voltage Vpp to the source and Nwell of the floating-gate PMOSFET while grounding the control gate and the drain of the floating-gate PMOSFET causes injection of electrons into the floating gate by hot electron injection.

The charge on the floating-gate PMOSFET may be changed (erased) by applying a negative voltage to the top electrode (control gate) of the capacitor formed by the silicide blocking material while applying a positive voltage to the Nwell, the source and the drain of the floating-gate PMOSFET. Applying a negative voltage to the top electrode (control gate) of the capacitor formed by the silicide blocking material while applying a positive voltage to the Nwell, the drain and the source of the floating-gate PMOSFET causes Fowler-Nordheim tunneling which causes electrons to be removed from the floating-gate.

In this embodiment, a PMOSFET and an analog capacitor are also fabricated concurrently with a floating-gate PMOSFET. When a PMOSFET or an analog capacitor is fabricated, the silicide blocking material is not deposited on the poly-silicon gate to block the silicide. Rather, the poly-silicon gate is allowed to be silicided. Because a floating-gate PMOSFET, a PMOSFET and an analog capacitor may be fabricated on the same substrate using similar processing steps, an EEPROM cell along with analog circuits may be fabricated at a relatively low cost.

Figure 1:
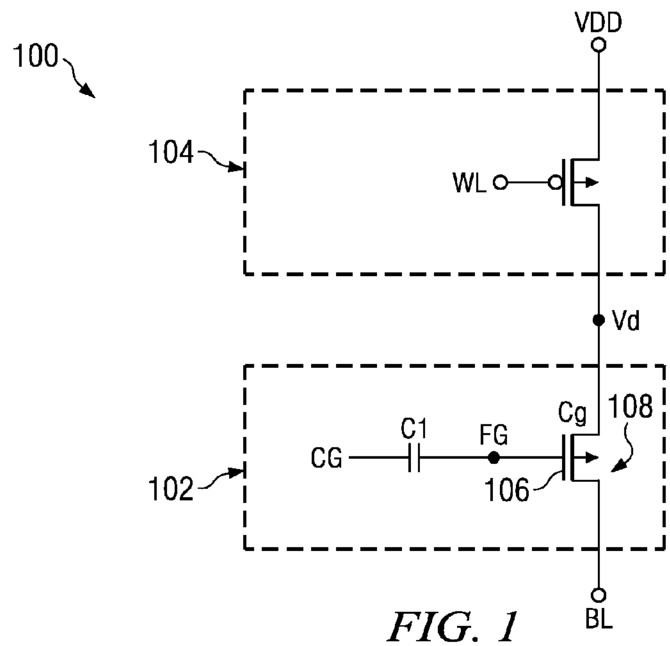
FIG. 1 is a schematic drawing of an embodiment of a programmable non-volatile EEPROM memory cell.

FIG. 1 is a schematic drawing of an embodiment of a programmable non-volatile EEPROM memory cell 100. The memory cell 100 contains a PMOSFET 104 and a floating-gate PMOSFET 102. The source of the PMOSFET 104 is electrically connected to power supply VDD. The gate of PMOSFET 104 is electrically connected to a word line WL in an array of programmable non-volatile EEPROM memory cells (See FIG. 2). The drain of the PMOSFET 104 is electrically connected to the source Vd of the floating gate PMOSFET 102.

The floating-gate PMOSFET 102 has a capacitor C1 connected in series with gate capacitance Cg. The capacitor C1 has an electrode CG (control gate) and an electrode FG. The floating gate FG is electrically insulated from other electrodes. Because the floating gate FG is electrically insulated from other electrodes, the floating gate FG "floats" and is able to retain charge for a long period of time. The drain of PMOSFET 106 is electrically connected to a bit line BL.

The floating-gate PMOSFET 102 may be programmed, in this example, by applying the following conditions for approximately 100 micro-seconds: 1) applying a programming voltage Vpp in place of the operating voltage Vdd while applying zero volts to the gate WL of PMOSFET 104, 2) applying programming voltage Vpp to the Nwell 108 of floating-gate PMOSFET 102 and 3) grounding the control gate CG and the bit line BL. The programming voltage in this example ranges from approximately 7 volts to 9 volts.

The charge on the floating-gate PMOSFET 102 may be erased by applying approximately −7 volts on the electrode CG and approximately 8 volts on the Nwell 108, the source Vd, and the drain BL of the PMOSFET 106 for approximately 100 milli-seconds.

The programmable non-volatile EEPROM memory cell 100 may be read by applying approximately 0 volts on the word line WL. When the floating-gate PMOSFET 102 is programmed, there is a negative charge on the poly floating gate FG which causes an inversion layer to form in the channel of the floating-gate PMOSFET 102. The inversion layer will then conduct current to a bit line BL where a sense amp (not shown) at the end of the bit line BL will detect a change in voltage or current. The change in voltage or current may then be amplified by the sense amp to provide a logical digital output. When no inversion layer is formed in the channel of the floating-gate PMOSFET, no current can be conducted through the floating-gate PMOSFET.

Figure 2:
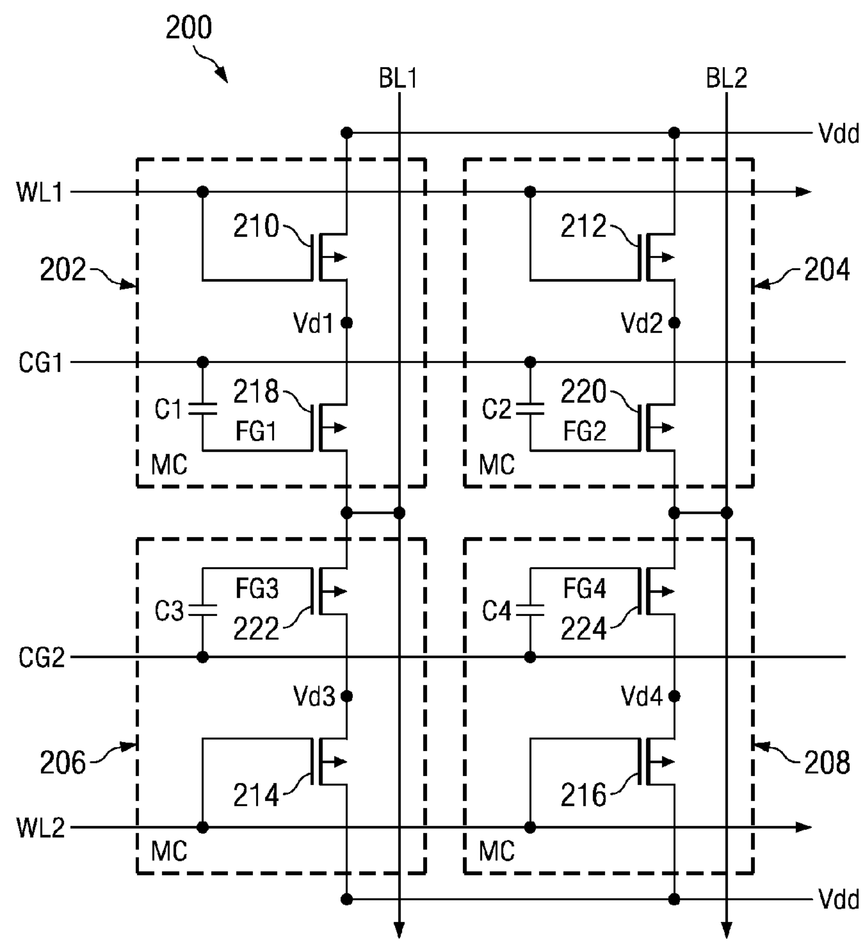
FIG. 2 is a schematic drawing of an embodiment of four programmable non-volatile EEPROM memory cells.

FIG. 2 is a schematic drawing of an embodiment of an array 200 with four programmable non-volatile EEPROM memory cells 202, 204, 206 and 208. A programmed memory cell, for example memory cell 202, may be read by applying 0 volts on word line WL1. With zero volts applied to word line WL1, current or voltage may be sensed by a sense amp (not shown) on bit line BL1. In this example, word line WL2 is held at a positive supply voltage VDD. Because word line WL2 is held at a positive supply voltage VDD, the logical state of memory cell 206 can not be read and does not interfere with the reading of memory cell 202 on bit line BL1.

In memory 200, memory cell 202 may be programmed, in this example, by applying the following conditions for approximately 100 micro-seconds: 1) applying a programming voltage Vpp in place of the operating voltage Vdd while applying zero volts to the gate WL1 of PMOSFET 210, 2) applying programming voltage Vpp to the Nwell of floating-gate PMOSFET 218 and 3) grounding the control gate CG1 and the bit line BL1. Word line WL2 is held at VDD during the programming of memory cell 202. The programming voltage Vpp in this example ranges from approximately 7 volts to 9 volts.

In this example after memory cell 202 is programmed, memory cell 208 may be programmed, by applying the following conditions for approximately 100 micro-seconds: 1) applying a programming voltage Vpp in place of the operating voltage Vdd while applying zero volts to the gate WL2 of PMOSFET 216, 2) applying programming voltage Vpp to the Nwell of floating-gate PMOSFET 224 and 3) grounding the control gate CG2 and the bit line BL2. Word line WL1 is held at VDD during the programming of memory cell 202. The programming voltage Vpp in this example ranges from approximately 7 volts to 9 volts.

Figure 3A:
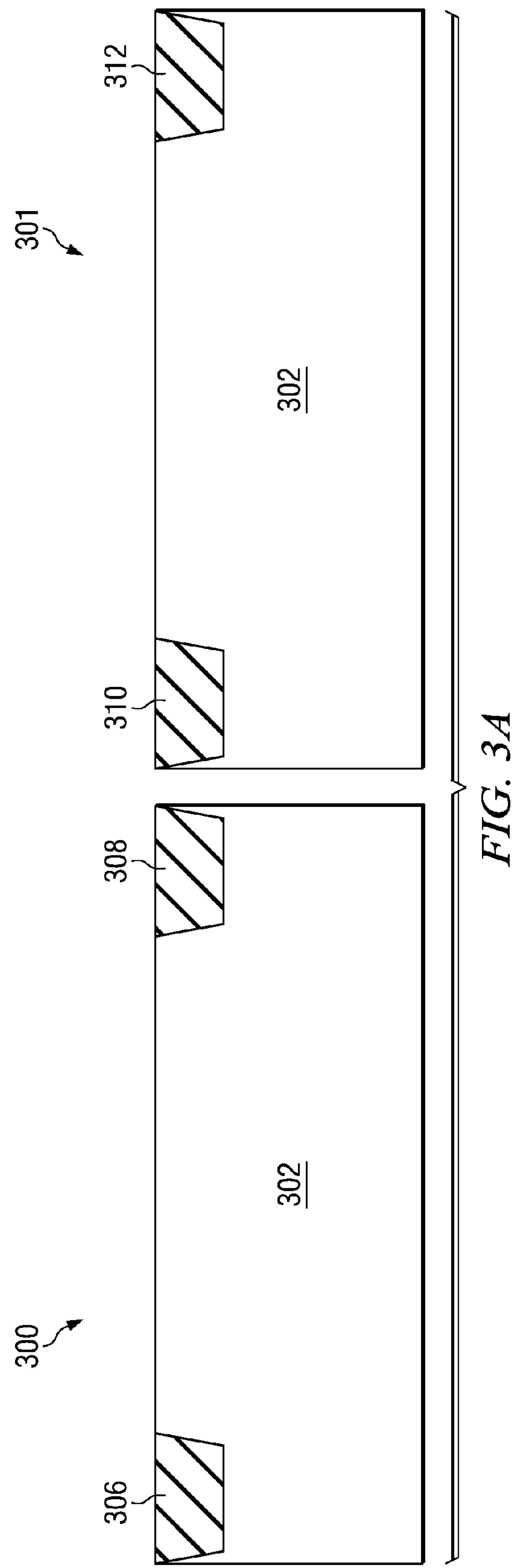
FIGS. 3A-3J are cross sectional views of an embodiment of a method for fabricating a floating-gate p-type MOSFET and a p-type MOSFET concurrently.
Figure 3B:
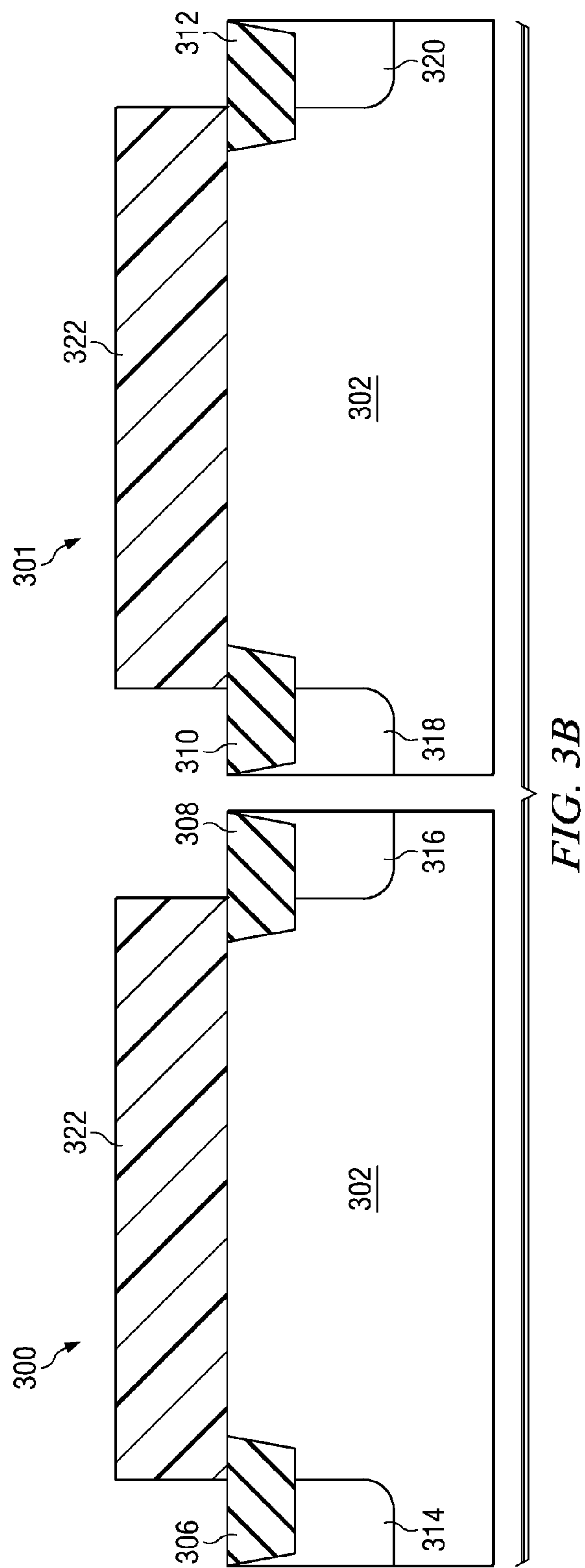

FIGS. 3A-3J are cross sectional views of an embodiment of a method for fabricating a floating-gate p-type MOSFET 300 and a p-type MOSFET 301 concurrently. The cross-sectional view shown in FIG. 3A shows thick oxide regions 306, 308, 310, 312 formed in substrate 302. The substrate 302 may be an n-type or p-type substrate. In this example swallow-trench isolation (STI) is used to form the thick oxide regions 306, 308, 310, 312. However, in another embodiment local oxidation of silicon (LOCOS) may be used to form the thick oxide regions 306, 308, 310, 312. The cross-sectional view shown in FIG. 3B illustrates Pwells 314, 316, 318, 320 implanted through the thick oxides 306, 308, 310, 312 into the substrate 302. The substrate may be a p-type or n-type substrate. A resist 322 is applied to prevent Pwells from being formed in the areas under the resist 322.

Figure 3C:
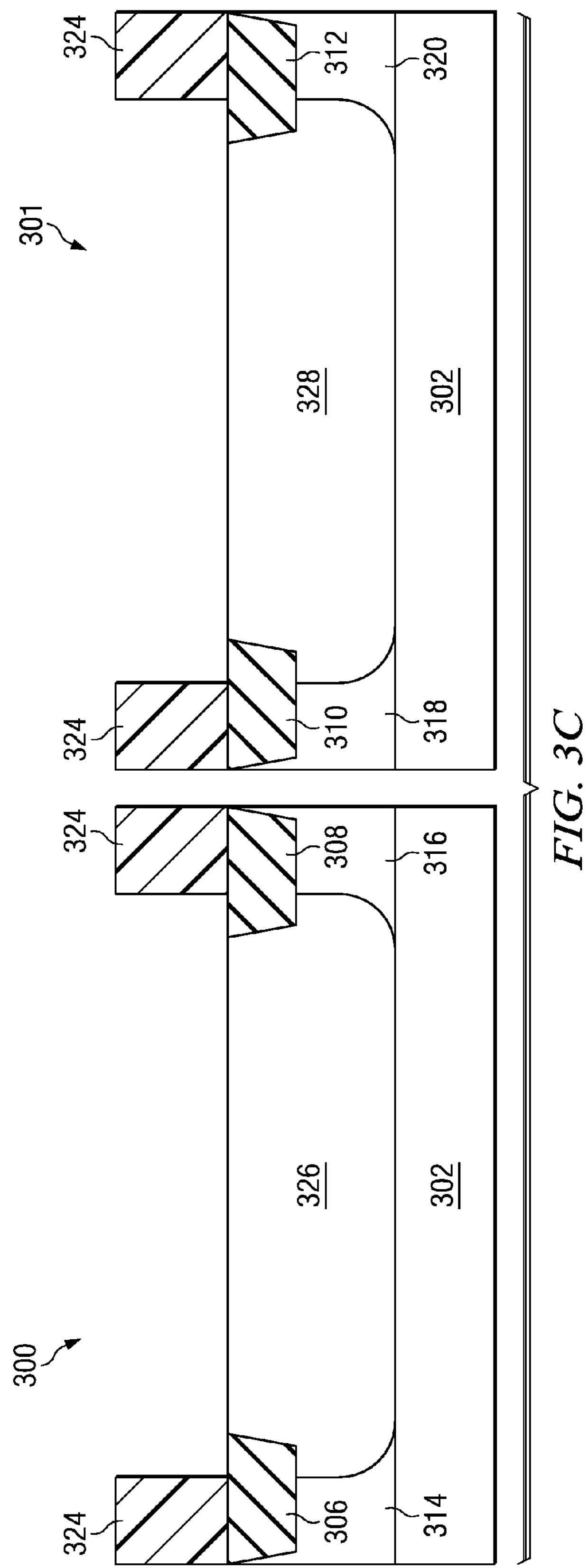
Figure 3D:
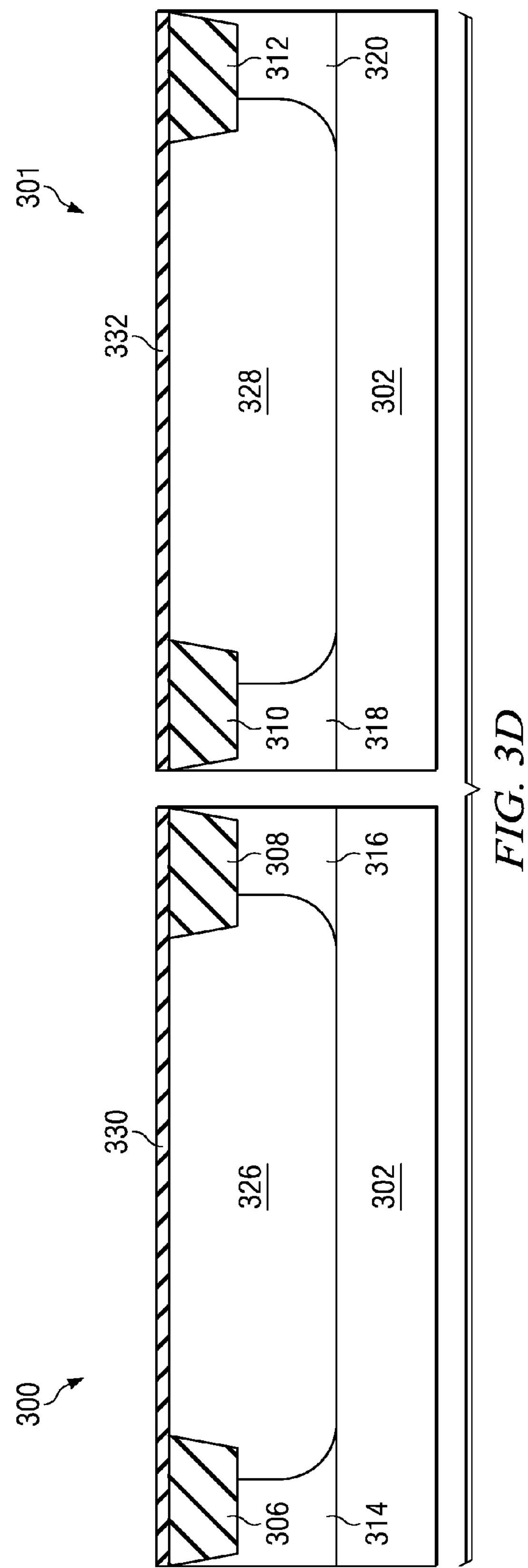

The cross-sectional view shown in FIG. 3C illustrates two Nwells regions 326 and 328 formed in the substrate 302. The resist 324 is applied to prevent the Nwell implant from going through the thick oxide regions 306, 308, 310, 312 into the Pwell regions 314, 316, 318, 320 respectively. After the resist 324 is removed, an insulation is grown. The cross-sectional view shown in FIG. 3D illustrates an insulation 330 and 332 grown over the Nwell regions 326, 328 and on the thick oxide regions 306, 308, 310, 312. The insulation 330 may comprise an oxide, a nitride and a combination of an oxide and nitride, for example. The insulation 330 may also be a high K dielectric insulator.

Figure 3E:
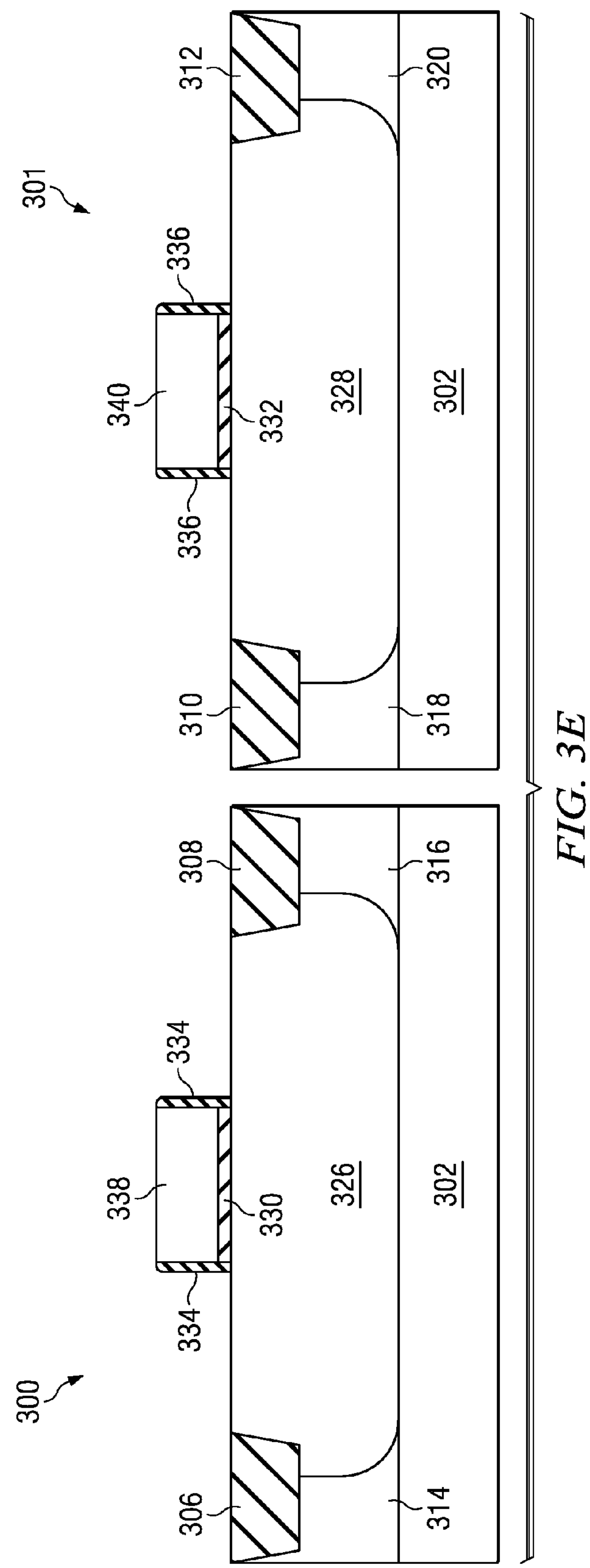
Figure 3F:
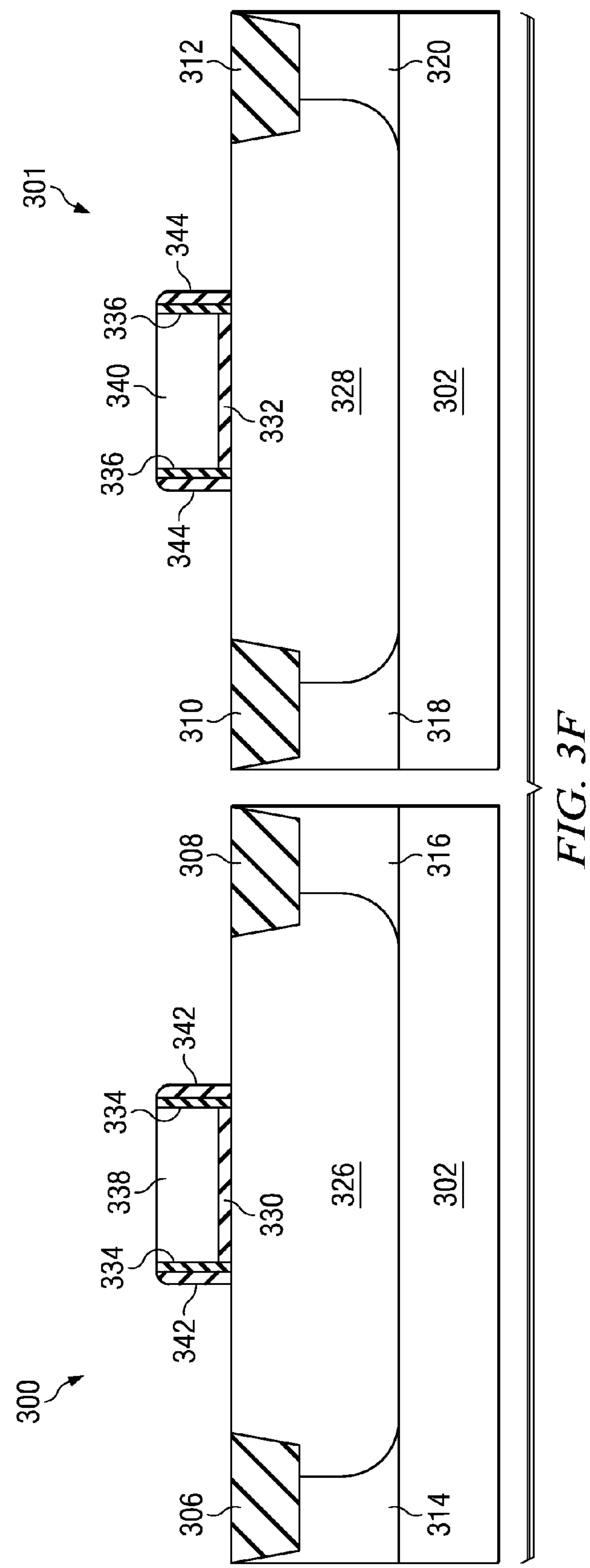
Figure 3G:
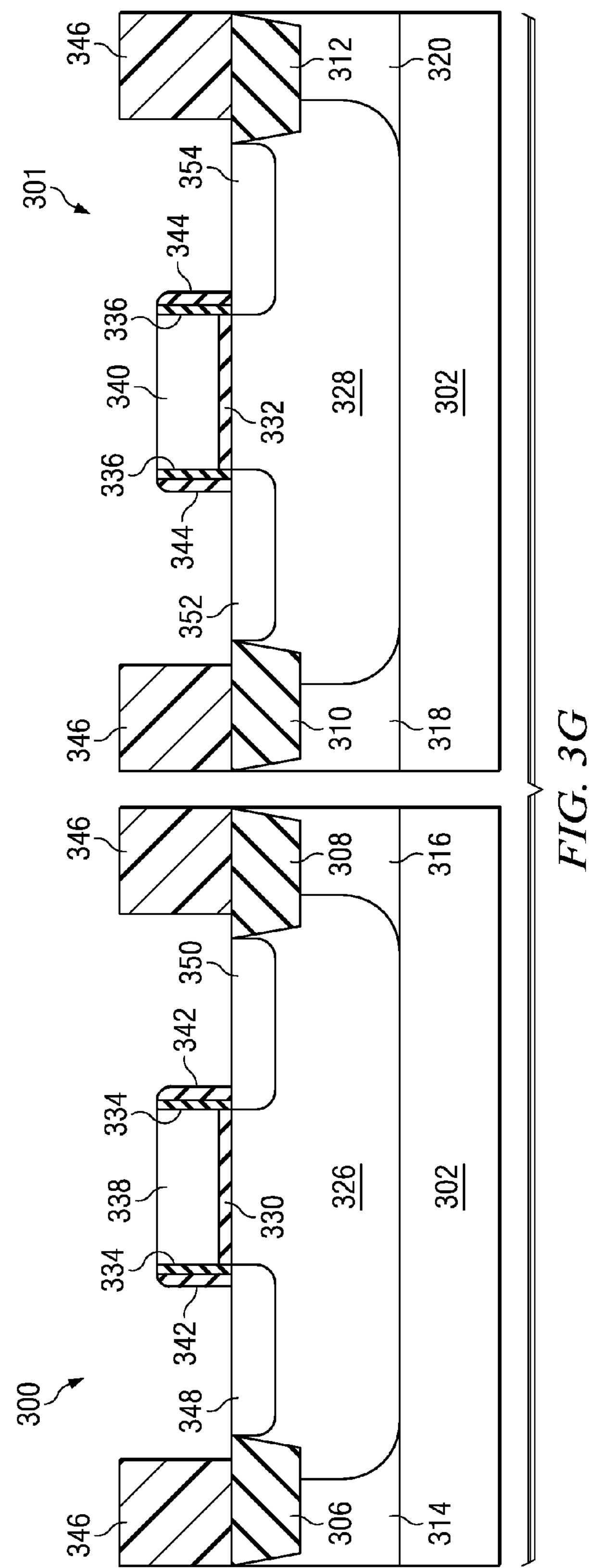

After the insulation 330 is grown, a poly-silicon layer is deposited over the insulation region 330. The poly-silicon layer is then etched to form poly-silicon gates 338 and 340 as shown in FIG. 3E. Also, shown in FIG. 3E are oxide side-walls 334 and 336 grown on poly-silicon gates 338 and 340 respectively. FIG. 3F illustrates nitride side-walls 342 and 344 grown on oxide side walls 334 and 336 respectively. FIG. 3G illustrates a resist 346 deposited over portions of the thick-oxide regions 306, 308, 310 and 312. While the resist 346 is deposited over portions of the thick-oxide regions 306, 308, 310 and 312, a source 348 and a drain 350 for poly-silicon gate 338 and a source 352 and a drain 354 for poly-silicon gate 340 are formed by ion-implantation. After the sources 348, 352 and the drains 350, 354 are formed, the resist 346 is removed.

Figure 3H:
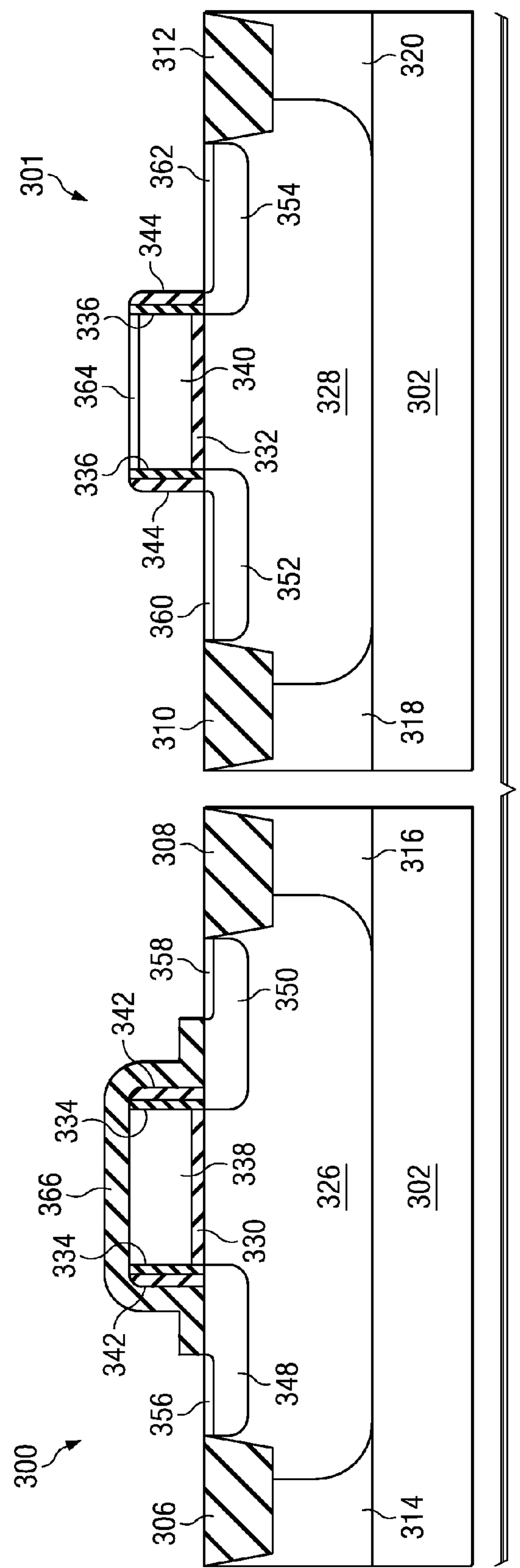

FIG. 3H illustrates a silicide blocking layer 366 that is deposited and then patterned to protect areas of a silicon surface from being silicided. Next begins a thin transition metal layer is fully formed and patterned over semiconductor devices 300 and 301. The substrate 302 is heated, allowing the transition metal to react with exposed silicon in the active regions of the semiconductor device (e.g., sources 348, 352, drains 350, 354, gate 364) forming low-resistance transition metal silicides 356, 358, 360, 362 and 364. The transition metal does not react with the silicide blocking layer 366. Silicon dioxide and/or silicon nitride insulator, for example, may be used as a silicide blocking layer 366.

In an embodiment of the invention, the silicide blocking layer 366 and the nitride layer 370 are also used as an insulator to form a capacitor C1 (FIG. 1) in series with the capacitor Cg formed by the insulator 330 under the poly-silicon gate 338 (FIG. 3H). The poly-silicon gate 338 forms one electrode for capacitor C1 and for the capacitor Cg.

Figure 3I:
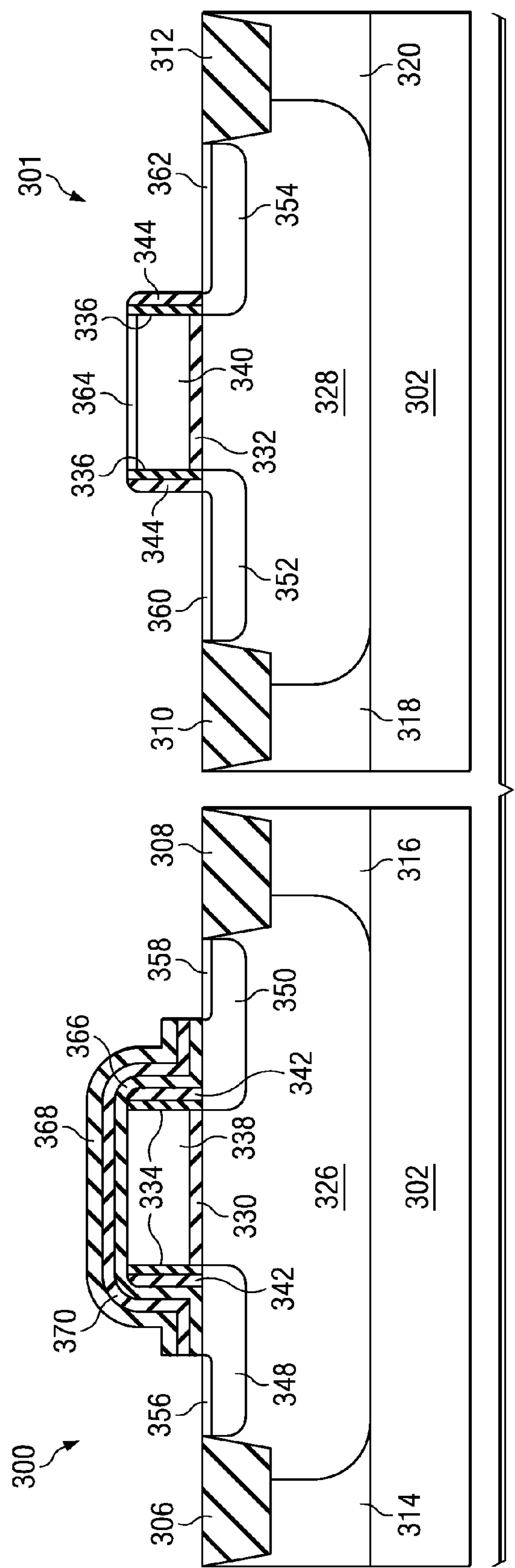
Figure 3J:
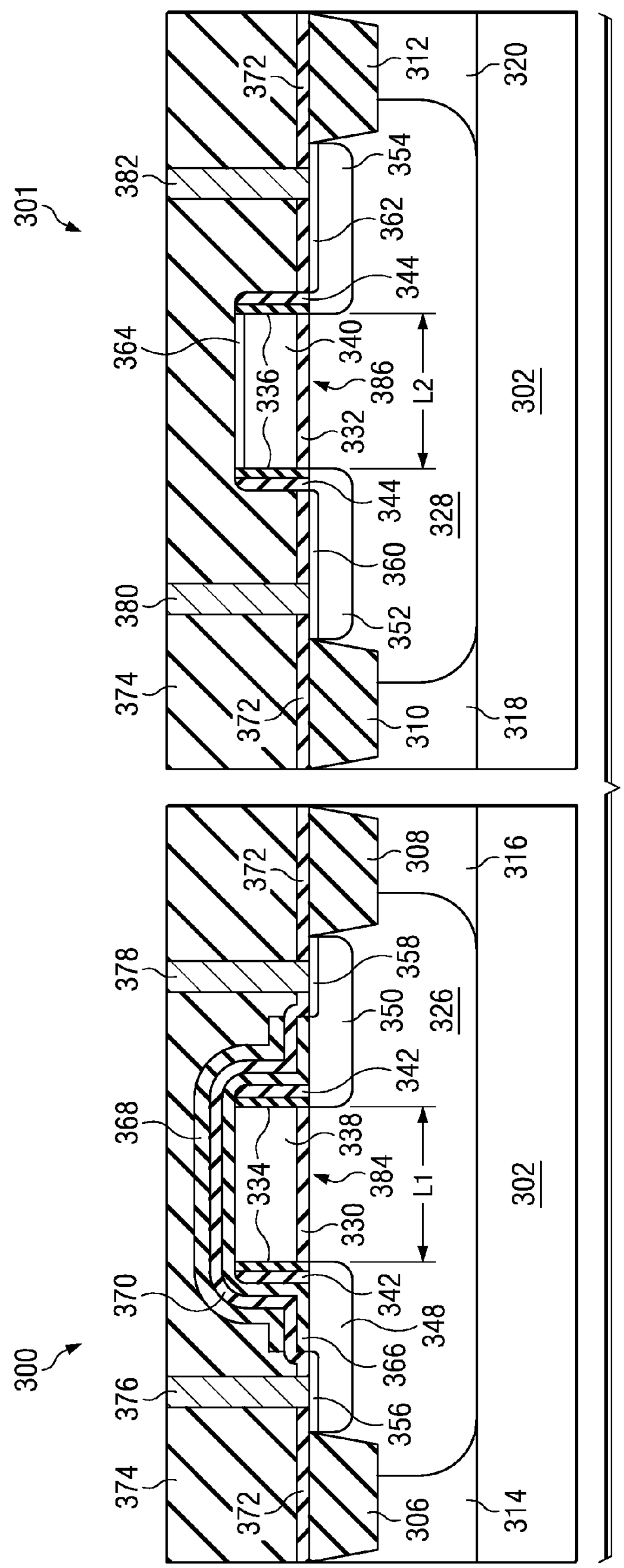

FIG. 3I illustrates a part of the process where a nitride layer 370 is formed on the silicide blocking layer 336. After forming the nitride layer 370, a conductive layer 368 is formed on the nitride layer 370. The conductive layer 368 acts as a second electrode CG for the capacitor C1 (FIG. 1). The conductive layer 368 is also used in the formation of analog capacitors as is explained in more detail later (See FIG. 5). The conductive layer 368 may be formed using, for example, TaN, TiN or poly-silicon. Next a SiN layer 372 is deposited over the top of all areas as shown in FIG. 3J. The SiN layer 372 is used as an contact etch stop.

After the SiN layer 372 is formed, a phosphorus-doped silicate glass (PSG) layer 374 is formed over both the floating-gate P-type MOSFET 300 and the P-type MOSFET 301. The PSG layer 374 is then etched, stopping at SiN layer 372. SiN layer 372 is then etched. After the PSG layer 374 is etched, metal (e.g. tungsten) is deposited to form metal contacts 376, 378, 380, and 382 to the source and drains 348, 350, 352, 354 of the floating-gate P-type MOSFET 300 and the P-type MOSFET 301.

The channel length L1 of floating-gate P-type MOSFET 300 and the channel length L2 of P-type MOSFET 301 are shown in FIG. 3J. The channel region 384 of floating-gate P-type MOSFET 300 is located below the insulator 330 and between the source 348 and drain 350 of floating-gate P-type MOSFET 300 while the channel region 386 of P-type MOSFET 301 is located below the insulator 332 and between the source 352 and drain 354 of floating-gate P-type MOSFET 301.

Figures 4, 5:
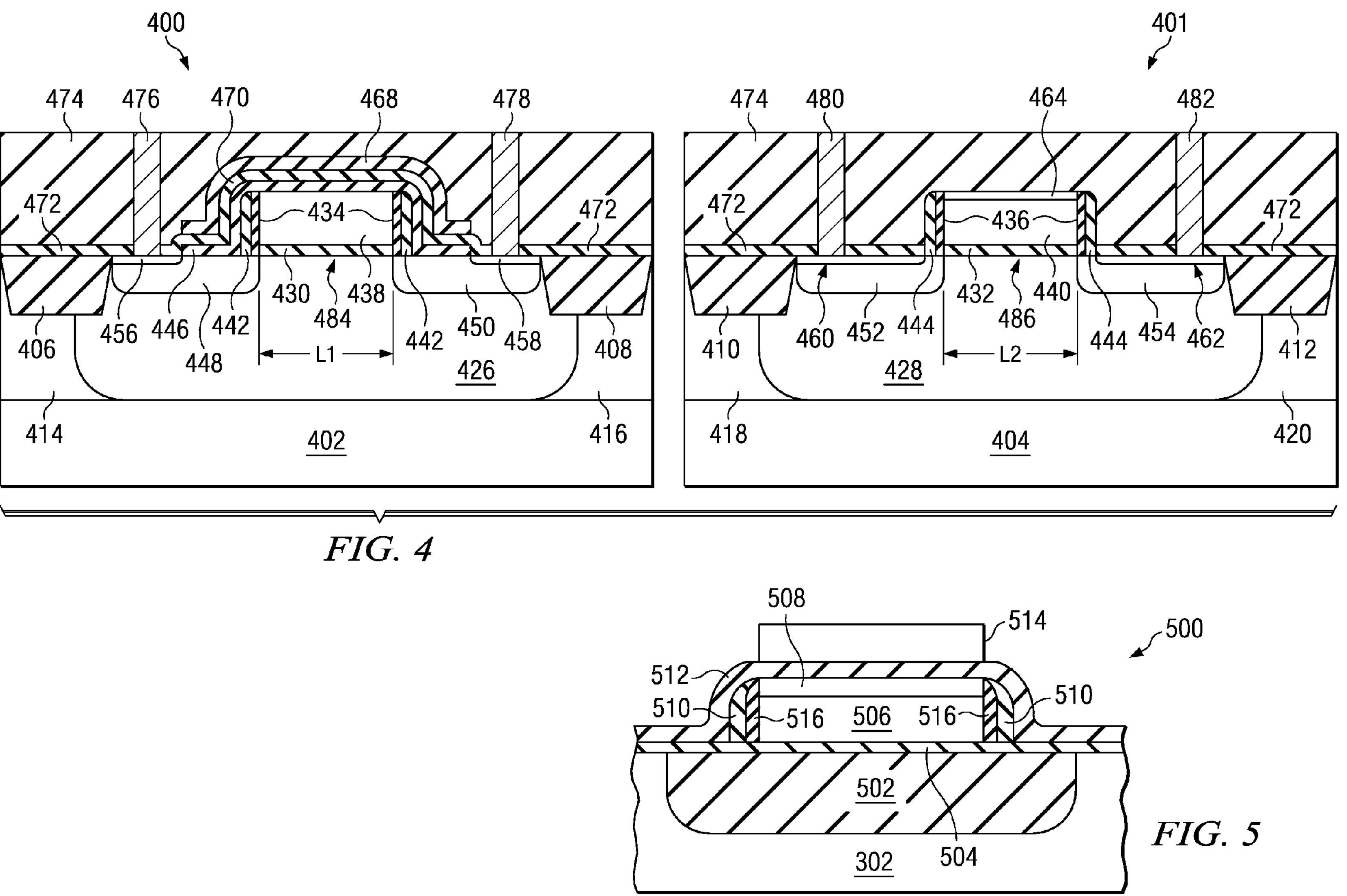
FIG. 4 is cross sectional view of an embodiment of a floating-gate n-type MOSFET and an n-type MOSFET.
FIG. 5 is cross sectional view of an embodiment of an analog capacitor.

In the previous embodiment of the invention, a floating-gate P-type MOSFET 300 and a P-type MOSFET 301 were fabricated concurrently. In another embodiment, a floating-gate N-type MOSFET 400 and an N-type MOSFET 401 may be fabricated concurrently. FIG. 4 is cross sectional view of an embodiment of a floating-gate n-type MOSFET and an n-type MOSFET. In this embodiment, the floating-gate N-type MOSFET 400 is fabricated on a substrate 402. The substrate may be an n-type substrate or a p-type substrate. A Pwell 426 is located below the n-type doped source 448, the gate 430, and the n-type doped drain 450 of the floating-gate N-type MOSFET 400. Nwells 414 and 416 are located below swallow-trench isolators 406 and 408 respectively. The poly-silicon gate 438 has oxide side-walls 434 and nitride side-walls 442.

The source 448 and the drain 450 have silicided portions 456 and 458 source 448 and the drain 450 are covered by a silicide blocking layer 466. A nitride layer 470 covers the silicide blocking layer 446. A conducting layer 468 covers the silicide blocking layer 470. A SiN layer 472 covers the STI regions 406 and 408, portions of the source 448 and the drain 408.

A phosphorus-doped silicate glass (PSG) layer 474 is formed over the floating-gate N-type MOSFET 400. The PSG layer 474 is then etched. Metal contacts 476 and 478 make electrical connections to the source 448 and drain 450 of the floating-gate N-type MOSFET 400.

In this embodiment, the N-type MOSFET 401 is fabricated on a substrate 402. A Pwell 428 is located below the n-type doped source 452, the gate 440, and the n-type doped drain 452 of the N-type MOSFET 401. Nwells 418 and 420 are located below swallow-trench isolators 410 and 412 respectively. The poly-silicon gate 440 has oxide side-walls 436 and nitride side-walls 444.

The source 448, the drain 450 and the gate 440 have silicided portions 460, 462 and 464 respectively. A SiN layer 472 covers the STI regions 410 and 412, the source 452 and the drains 454. A phosphorus-doped silicate glass (PSG) layer 474 is formed over the N-type MOSFET 401. The PSG layer 474 is then etched. Metal contacts 480 and 482 make electrical connections to the source 452 and drain 454 of the floating-gate N-type MOSFET 401.

The channel length L1 of floating-gate N-type MOSFET 400 and the channel length L2 of N-type MOSFET 401 are shown in FIG. 4. The channel region 484 of floating-gate N-type MOSFET 400 is located below the insulator 430 and between the source 448 and drain 450 of floating-gate N-type MOSFET 400 while the channel region 486 of N-type MOSFET 401 is located below the insulator 432 and between the source 452 and drain 454 of floating-gate N-type MOSFET 302.

An analog capacitor may also be fabricated concurrently, on the same substrate 302, with the floating-gate P-type MOSFET 300 and the P-type MOSFET 301 shown in FIG. 3J. FIG. 5 is a cross-sectional view of an embodiment of an analog capacitor 500. The analog capacitor 500 may serve, for example, as a capacitor within the same electrical circuit incorporating a float-gate P-type MOSFET or in another circuit.

A lower plate of analog capacitor 500 is formed of another instance of poly-silicon 506 and metal silicide 508, overlying an isolation dielectric structure 502 (in this example, an STI structure) and gate dielectric 504. In this example of an analog capacitor 500, silicide-block is not present (i.e., has been removed) over poly-silicon element 506. As such, metal silicide 508 has been formed over poly-silicon element 506, consuming some of the poly-silicon element 506 in forming this cladding.

Sidewall nitride elements 510 are formed over sidewall oxide elements 516. Sidewall nitride elements 510 preclude the formation of metal silicide 508 on the sidewall of the poly-silicon element 506. Silicon nitride 512 is disposed over metal silicide 508, over which metal nitride 514 (the top plate of capacitor 500) is deposited and patterned as shown.

Because the upper plate 514 is formed with highly conductive materials (e.g. TaN or TiN) and the lower plate 508 is formed with a high conductive material (silicided poly-silicon), the capacitor 500 has a low temperature coefficient and a low voltage coefficient. A low temperature coefficient and a low voltage coefficient are desirable in an analog capacitor. The capacitor 500 also has high capacitance due to the high dielectric coefficient of the silicon nitride layer 512.

The foregoing description has been presented for purposes of illustration and description. It is not intended to be exhaustive or to limit the invention to the precise form disclosed, and other modifications and variations may be possible in light of the above teachings. The embodiments were chosen and described in order to best explain the applicable principles and their practical application to thereby enable others skilled in the art to best utilize various embodiments and various modifications as are suited to the particular use contemplated. It is intended that the appended claims be construed to include other alternative embodiments except insofar as limited by the prior art.

What is claimed is:

1. A method of fabricating a floating-gate p-type MOSFET comprising:

forming a first and a second thick oxide region on a p-type substrate;

implanting a first and a second Pwell region below the first and second thick oxide region respectively;

implanting an Nwell region between the first and second thick oxide regions and the first and second Pwells;

growing a gate insulation on the Nwell region;

depositing poly-silicon on the gate insulation;

etching the poly-silicon to form a poly-silicon gate;

forming oxide side-walls on sides of the poly-silicon gate;

forming nitride side-walls on the oxide side-walls;

implanting an p-type dopant into the Nwell on both sides of the nitride side-walls forming a source and a drain;

forming a silicide-blocking layer over the poly-silicon gate, the oxide side-walls, the nitride walls, a first portion of the source and a first portion of the drain;

forming a silicide on a second portion of the source and on a second portion of the drain;

forming a nitride layer over the silicide-blocking layer, the poly-silicon gate, the oxide side-walls, the nitride walls, the first portion of the source and the first portion of the drain;

forming a conductive layer over the nitride layer;

forming metal contacts on the second portion of the source and on the second portion of the drain.

2. The method of claim 1 wherein the insulator is selected from a group consisting of an oxide, a nitride, and an oxide/nitride combination.

3. The non-volatile anti-fuse memory cell of claim 1 wherein the insulator is a high K dielectric insulator.

4. The method of claim 1 wherein the thick oxide region is selected from a group consisting of a swallow-trench isolation and locos (local oxidation of silicon) isolation.

5. The method of claim 1 wherein the conductive layer is selected from a group consisting of TaN, TiN and poly-silicon.

6. A method of fabricating a floating-gate p-type MOSFET, a p-type MOSFET and an analog capacitor concurrently comprising:

forming a first, a second, a third, a fourth, and a fifth thick oxide region on an p-type substrate;

implanting a first and a second Pwell region below the first and the second thick oxide region respectively and a third and a fourth Pwell region below the third and the fourth thick oxide region respectively;

implanting a first Nwell region between the first and the second thick oxide regions and a second Nwell region between the third and the fourth thick oxide region;

growing a gate insulation on the first and second Nwell regions and on the fifth thick oxide region;

depositing poly-silicon on the gate insulation;

etching the poly-silicon to form a first, a second and a third poly-silicon portion;

forming oxide side-walls on sides of the first, the second and the third poly-silicon portions;

forming nitride side-walls on the oxide side-walls;

implanting an p-type dopant into the first and the second Nwells forming a first and a second source and a first and a second drain;

forming a silicide-blocking layer over the first poly-silicon portion, the oxide side-walls of the first poly-silicon portion, the nitride walls of the first poly-silicon portion, a first portion of the first source and a first portion of the first drain;

forming a silicide on a second portion of the first source, on a second portion of the first drain, on a first portion of the second source, on a first portion of the second drain, on the second poly-silicon portion, and on the third poly-silicon portion;

forming a nitride layer over the silicide-blocking layer and over the silicide on the third poly-silicon portion;

forming a conductive layer over the nitride layer;

forming metal contacts on the second portion of the first source, the second portion of the first drain, the first portion of the second source, and the first portion of the second drain.

7. The method of claim 6 wherein the insulator is selected from a group consisting of an oxide, a nitride, and an oxide/nitride combination.

8. The non-volatile anti-fuse memory cell of claim 6 wherein the insulator is a high K dielectric insulator.

9. The method of claim 6 wherein the thick oxide region is selected from a group consisting of a swallow-trench isolation and locos (local oxidation of silicon) isolation.

10. The method of claim 6 wherein the conductive layer is selected from a group consisting of TaN, TiN and poly-silicon.

11. A method of fabricating a floating-gate n-type MOSFET comprising:

forming a first and a second thick oxide region on an n-type substrate;

implanting a first and a second Nwell region below the first and second thick oxide region respectively;

implanting an Pwell region between the first and second thick oxide regions and the first and second Nwells;

growing a gate insulation on the Pwell region;

depositing poly-silicon on the gate insulation;

etching the poly-silicon to form a poly-silicon gate;

forming oxide side-walls on sides of the poly-silicon gate;

forming nitride side-walls on the oxide side-walls;

implanting an n-type dopant into the Pwell on both sides of the nitride side-walls forming a source and a drain;

forming a silicide-blocking layer over the poly-silicon gate, the oxide side-walls, the nitride walls, a first portion of the source and a first portion of the drain;

forming a silicide on a second portion of the source and on a second portion of the drain;

forming a nitride layer over the silicide-blocking layer, the poly-silicon gate, the oxide side-walls, the nitride walls, the first portion of the source and the first portion of the drain;

forming a conductive layer over the nitride layer;

forming metal contacts on the second portion of the source and the second portion of the drain.

12. The method of claim 11 wherein the insulator is selected from a group consisting of an oxide, a nitride, and an oxide/nitride combination.

13. The non-volatile anti-fuse memory cell of claim 11 wherein the insulator is a high K dielectric insulator.

* * * * *